United States Patent [19]

D'Altroy et al.

[11] 4,066,483
[45] Jan. 3, 1978

[54] GATE-CONTROLLED BIDIRECTIONAL SWITCHING DEVICE

[75] Inventors: Frederick A. D'Altroy; Daniel J. Harrington; Gerald W. Miller, all of Center Valley, Pa.

[73] Assignee: Western Electric Company, Inc., New York, N.Y.

[21] Appl. No.: 703,162

[22] Filed: July 7, 1976

[51] Int. Cl.² .......................................... H01L 21/225
[52] U.S. Cl. .................................. 148/187; 148/33.5; 148/188; 357/39
[58] Field of Search ....................... 148/187, 188, 33.5; 357/39

[56] References Cited

U.S. PATENT DOCUMENTS

| | | | |
|---|---|---|---|
| 3,275,909 | 9/1966 | Gutzwiller | 357/39 |
| 3,327,183 | 6/1967 | Greenberg et al. | 357/38 |
| 3,350,611 | 10/1967 | Scace | 357/39 |
| 3,391,310 | 7/1968 | Gentry | 357/39 |
| 3,409,810 | 11/1968 | Matzen | 357/39 |
| 3,419,766 | 12/1968 | Ono | 357/23 |
| 3,484,309 | 12/1969 | Gilbert | 148/33.5 |
| 3,622,842 | 11/1971 | Oberai | 357/34 |
| 3,631,303 | 12/1971 | Antypas et al. | 148/171 |
| 3,664,893 | 5/1972 | Frazee | 148/33.5 X |
| 3,681,667 | 8/1972 | Kokosa | 357/39 |
| 3,739,242 | 6/1973 | Foster | 357/39 |
| 3,914,780 | 10/1975 | Marek | 357/37 |
| 3,943,013 | 3/1976 | Kennedy et al. | 148/187 |
| 3,964,091 | 6/1976 | Berndes et al. | 357/39 |

Primary Examiner—G. Ozaki
Attorney, Agent, or Firm—W. O. Schellin

[57] ABSTRACT

A gate-controlled bidirectional switching device has two main terminals on opposite major surfaces of the device. A single gate terminal located adjacent one of the main terminals on one of the major surfaces receives a signal biased with respect to said one terminal to trigger the device into conduction. The device conducts current in either direction through the main terminals, depending on the polarity of an applied bias potential across the main terminals. By controlling the resistivities or the widths of two base regions in the device with respect to each other, a trigger current for switching the device from a nonconductive state to conduct current in the one direction is adjusted with respect to that required to switch the device to conduct current in the other direction.

5 Claims, 7 Drawing Figures

GATE-CONTROLLED BIDIRECTIONAL SWITCHING DEVICE

BACKGROUND OF THE INVENTION

1. Field of the Invention

The present invention relates to gate-controlled bidirectional semiconductor switching devices. More particularly, the invention relates to controlling the threshold of a current required to trigger such a device to conduct in one direction through the terminals with respect to the threshold of a current required to trigger the device to conduct in the other direction.

2. Discussion of the Prior Art

Bidirectional semiconductor switching devices are well known in the art. Such devices, having two main terminals and a third terminal, referred to as a gate terminal, are known as gate-controlled bidirectional switching devices. These devices find use, for example, in the bidirectional control of alternating currents.

The devices are typically formed from a thin wafer of semiconductor material of a negative conductivity type. Into this wafer selective base and then emitter regions of successively opposite conductivity types are formed adjacent both major surfaces of the wafer in accordance with prior art practices. The emitter regions lie partially laterally offset within the base regions whereby two laterally displaced parallel domains are formed, each leading vertically through the wafer from one major surface to the other. Each such domain includes four regions of successively opposite conductivity types starting with a region of positive conductivity type. In total, five regions of alternately opposite conductivity types are present across the thickness of the wafer, of which the emitter regions lie laterally offset within the base region.

Where it is desired that the current path in such a device extend the length of each of such domains through the thickness of the wafer, the two main terminals typically are located one on each of the major surfaces of the wafer. However, the geometry of the devices is not completely similar on each of the major surfaces of the wafer. The third terminal, the gate terminal, is typically located adjacent one of the major terminals on one major surface of the wafer. A signal in the form of a voltage resulting in a current flow into or out of the gate terminal triggers the device into a conductive state. The device then conducts a current in either one or the other direction through the two main terminals depending on the polarity of an applied bias voltage across the two main terminals at the time the device is triggered.

Because of the location of the gate terminal on one surface but not on the other, differences exist in the physical phenomena involved in triggering the device to conduct in one direction or in the other. When the device is triggered into conduction in the one direction, a blocking or a reverse biased junction borders a region of conductivity type which terminates partly in ohmic contact with the gate terminal. When the device is triggered into conduction in the other direction, a similar reverse biased junction is located remote from the gate, separated by a forward biased junction and the region of conductivity type located in the major portion and center of the body of the device.

It is therefore known that in such a device the trigger current required to initiate conduction in one direction tends to differ from that required to initiate conduction in the other direction. Attempts have already been made to equalize the threshold of the two trigger currents at which the device starts to conduct in the one as well as in the other direction.

A proposed prior art solution relates to arranging the gate electrode in proximity of the current paths for conduction in each of the directions through the device. However, for some modes of operation of prior art devices, it is nevertheless still customary to specify triggering characteristics in terms of a minimum trigger current or voltage at which the device becomes conductive in either direction. For circuit applications where low threshold or sensitive trigger currents are a requirement, a device with a trigger current of a sufficiently low threshold level in one direction may have a trigger current threshold level in the other direction which is so sensitive that the device may be triggered sporadically by noise pulses occurring in the respective circuit. While such noise problems may be overcome by additional buffer circuitry, it is nevertheless desirable to manufacture a gate-controlled bidirectional semiconductor switching device in a manner which provides substantially equal thresholds for the currents required to trigger the device into conduction in either of the two directions.

SUMMARY OF THE INVENTION

It is, therefore, an object of the invention to provide new and improved gate-controlled bidirectional semiconductor switching devices.

It is another object of the invention to control the relationship of the thresholds of trigger currents required to trigger such a switching device in one or in the other direction.

It is a further object of the invention to provide new and improved methods by which the thresholds of the trigger currents can be controlled during the manufacture of the respective devices.

In accordance with the invention, a gate-controlled bidirectional semiconductor switching device includes a first base located adjacent a gate electrode and a second base having a higher resistivity with respect to the first base, the second base being located more remotely from the gate electrode than the first base region.

In another aspect of the invention, two rectifying junctions are formed simultaneously in a semiconductor body at different depths from a surface of the body to establish boundaries of regions of different widths, whereby at least two operating characteristics become established with respect to each other.

In a further aspect of the invention a semiconductor switching device is formed. The device has two major conductive paths through a body portion thereof and a gate electrode through which trigger currents activate one or the other of the two major conductive paths depending on the presence and direction of bias voltages applied to terminals of the paths. A first base region is formed in proximity of the gate electrode and a second base region is formed more remotely from the gate electrode with respect to the first base region. The trigger currents are optimized with respect to each other by controlling the base width of the first base region in relation to the base width of the second base region to establish the desired trigger currents for each of the two paths associated with the two base regions respectively.

BRIEF DESCRIPTION OF THE DRAWING

The invention will be more readily understood when the following detailed description is read in conjunction with the accompanying drawing, wherein.

DETAILED DESCRIPTION

1. The Function of a Prior Art Device

Figure 1:
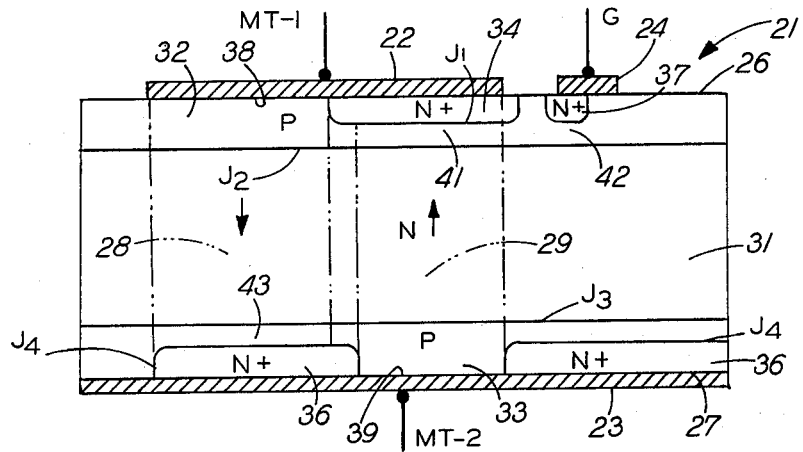
FIG. 1 is a schematic section through a typical prior art device.

FIG. 1 shows a schematic section through a prior art gate-controlled bidirectional switching device, which is generally designated by the numeral 21. The device 21 has three terminals, two main termiansl MT 1 and MT 2, and a gate terminal designated G. These three terminals include metallization pads 22, 23 and 24 on major surfaces 26 and 27 of the device 21.

When a voltage is applied between the pads 22 and 23, the device can be triggered from a nonconductive or high impedance state into a state of conductance or of low impedance. Depending on the polarity of the applied voltage between the pads 22 and 23, current conductance takes place through one of two major domains 28 or 29 of the device in the direction indicated by the respective arrows. For instance, when the pad 22 is positive with respect to the pad 23, the device becomes conductive through the domain 28.

The device 21 has five regions of interest which are alternately of opposite conductivity type. Describing these regions from a central body region 31 outward, toward both major surfaces 26 and 27 of the device 21, the central body region 31 is of negative or $n$ conductivity type. Adjacent the region 31 toward and terminating in some areas at the major surfaces 26 and 27, lie positive or $p$ conductivity type base regions 32 and 33, respectively. Spaced from the region 31, confined by the major surfaces 26 and 27, and embedded within the base regions 32 and 33 are located negative or $n$ conductivity type emitter regions 34 and 36. The emitter region 36 is of compound shape, so that the single region 36 is exposed in two separate places in the schematic section of the device 21. Next to the emitter region 34, but separated therefrom, lies an $n$ conductivity type gate region 37. The $n$ conductivity type emitter and gate regions are typically more highly doped with n-type impurities than the central body region 31.

The metallization pad 22 is located on the surface 26 contiguous to and in ohmic contact with, both the n-type region 34 and the p-type region 32. The direct projection of a portion 38 of the pad 22 contiguous to the region 32 onto the region 36 constitutes the domain of conduction when the first main terminal MT-1 is biased to a positive voltage with respect to the second main terminal MT-2.

Also, the metallization pad 23 is located on the surface 27 contiguous to, and in ohmic contact with, both the n-type emitter region 36 and the p-type base region 33. The direct projection of a portion 39 of the pad 23 contiguous to the region 33 onto the region 34 constitutes domain 29 which becomes conductive when a bias voltage applied to the second main terminal MT-2 is positive with respect to the first main terminal MT-1.

The metallization pad 24 of the gate terminal G is also located contiguous to both the n-type gate region 37 and the p-type base region 32. Locating the pad in contact with the regions of both $n$ and $p$ conductivity type permits a negative as well as a positive potential to trigger the device 21 into conduction.

The trigger events occur when a trigger voltage is applied to the gate terminal G which is either positive or negative with respect to the first main terminal MT-1, and when a voltage is applied across the device 21 while it is in a nonconductive or high impedance state. The trigger current flows between the gate G and the terminal MT-1 through bases 41 and 42. Depending on the direction of the gate current, electrons are injected either from the n-type emitter region 34 or from the n-type gate region 37 into the bases 41 or 42 respectively. The injected electrons traverse the junction J2 and enter the n-type region lowering its potential with respect to the base region 32.

Depending now on which main terminal is biased positively with respect to the other, the trigger events differ. In both cases, a positive or hole current flows from the p-type region contacting the respective positively biased pad 22 or 23 into the n-type region 31 and toward the opposite p-type base region. The hole current thereby causes more electrons to be collected into the n-type region 31 from the respectively more negatively biased n-type emitter region. The further injection of electrons causes additional hole current. The electrons and holes are collected by the corresponding reverse biased junction, either J2 or J3. The junction (J2 or J3) becomes forward biased, thereby rendering the device 21 conductive. The continuous injection of electrons into the respective base such as the base 41 between the emitter region 34 and the n-type region 31 maintains the normally reverse biased junction in saturation, and maintains thereby the conductive state of the device 21 as long as a potential across the two main terminals results in sufficient current flow to sustain the saturation of the normally reverse biased junction.

When the first main terminal MT-1 is positively biased with respect to the other main terminal MT-2, a portion of the p-type region 33 between the emitter region 36 and the n-type region 31 functions as a base 43 and an adjacent junction J3 constitutes the reverse biased junction which becomes forward biased as the device 21 goes into conduction in the manner described hereinbefore.

2. An Embodiment of the Invention

Figure 2:
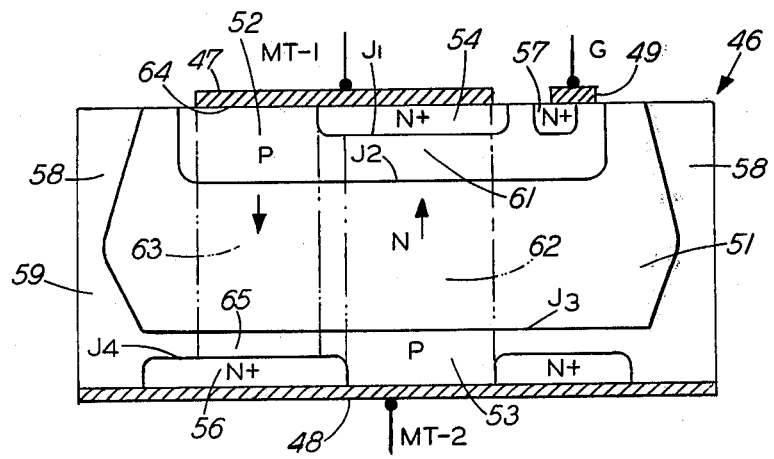
FIG. 2 is a schematic section through a device embodying the present invention.

Referring now to FIG. 2, a gate-controlled bidirectional switching device, designated generally by the numeral 46, embodies an aspect of the present invention. The device 46 includes first and second main terminals MT-1 and MT-2, and a gate terminal G. The first and second main terminals and the gate terminal include metallization pads 47, 48 and 49, respectively. Similar to the device 21, but in various respects distinct and different therefrom, the device 46 also includes five regions of alternately opposite conductive types to constitute a body region 51 of $n$ conductivity type, a first base region 52 of $p$ conductivity type adjacent the first main terminal MT-1 and the gate terminal G. A second base region 53 of $p$ conductivity type lies adjacent the second main terminal MT-2. First and second emitter regions 54 and 56 are embedded in the base regions 52 and 53 and are in ohmic contact with the pads 47 and 48, respectively. Also, an n-type gate region 57 lies embedded in the p-type region 52 and is in ohmic contact with the pad 49 of the gate terminal G. The p-type base region 53 extends into a p-type isolation region 58 which borders the lateral periphery 59 of the device 46. Such an isolation region 58 is known in the art to isolate electrical functions from interference with laterally disposed devices. The isolation region is shown here because of its typical presence in the type of device described herein as a preferred embodiment of the invention.

In the device 46, the regions of alternate conductivity type, except for the region of the isolation region 58, are similar in their function to the respective regions of the prior art device 21 of FIG. 1. When, for instance, the second main terminal MT-2 of the device 46 is biased with a positive potential with respect to the first main terminal MT-1, and a trigger current is caused to flow from the gate pad 49 to the pad 47, a base region 61 between the n-type emitter region 54 and the region 51 becomes locally forward biased with respect to the emitter region 54. The base region or base 61 is a subregion of the larger region 52. The emitter region 54 begins to emit electrons across a junction J1 toward a reverse biased junction J2 between the body region 51 and the base region 52. The electrons are collected by the junction J2, and as a result of such collection the potential of the region 51 is lowered with respect to the region 53.

Hole current flowing from the region 53 into the region 51 as a result of its lowered potential is again collected by the junction J2 further raising the potential of the base 61 with respect to the emitter region 54. And, again, more electrons are injected from the emitter region 54 across the base 61 toward the junction J2. As the electron injection from the emitter region 54 and the hole current from the region 53 increase, the junction J2 becomes saturated, and the device 46 goes into conduction. A domain 62 through which the device 46 conducts includes projected common portions of the regions 53, 51, 52 and 54, the base 61 being the projected portion of the p-type region 52. From the foregoing, it is seen that the junction J2 which becomes saturated bounds the base 61 which, in turn, is the only intervening region between the emitter region 54 and the junction J2. Consequently, the biasing effect of the gate current as well as the further bias resulting from the initiation of current flow through the main terminals act on the same junction J2 to drive that junction into saturation.

On the other hand, when the first main terminal MT-1 is biased by a positive potential with respect to the second main terminal MT-2 and the device 46 becomes conductive, a domain 63 extending from a portion 64 of the pad 47 in ohmic contact with the p-type region 52 in projection onto the pad 48 is the conductive path for the current flow through the device. The domain includes the *p-n-p-n* structure of the regions 52, 51, a region 65 which is a subregion of the p-type region 53, and the region 56, respectively. The region 65, part of the p-type region 53, lies between the n-type body region 51 and the emitter region 56, and is the base of the *n-p-n* structure formed by the regions 51, 65 and 56, respectively. A junction J3 between the region 51 and the region 53 is the only normally reverse biased junction in the current path through the domain 63 in the direction of the arrow, since the junction J2, and a junction J4 between the base 65 and the region 56 become forward biased by the applied potential between the terminals MT-1 and MT-2.

Again, however, a trigger bias voltage is applied between the gate terminal G and the first main terminal MT-1 to trigger the device into conduction. The gate current positively biases a more positive end of the base 61 of the region 52 with respect to the emitter region 54. Electrons are again emitted from the region 54 injected into the base 61, and diffused into the region 51, thereby lowering its potential with respect to the base region 52. A resultant hole current flows from the p-type region 52 into the region 51 to be collected by the junction J3 and to flow laterally through the base 64 toward an ohmic junction of the region 53 with the pad 48. The base current causes the region 56 to emit electrons into the base 65. The electrons are collected by the junction J3 and enter the region 51, further lowering the potential of that region with respect to the base region 52. As a result, the current through the domain 63 increases until the device 46 is turned on.

In the last described phenomenon, two regions emit electrons, instead of one, to ultimately drive the normally reverse biased or blocking rectifying junction J3 into saturation. The gate current appears to have only a secondary effect on saturating the junction J3. Consequently, in prior art devices, such as the device 21 of FIG. 1, when the first main terminal MT-1 is biased positively with respect to the second main terminal MT-2 and when the positive trigger current flows from the gate terminal to the first main terminal MT-1, a tendency exists for the device 21 to require a greater gate current to go into conduction then when the terminal MT-2 is biased positive with respect to the terminal MT-1. While the prior art has recognized this tendency and has tried to overcome or to minimize its effect by the planar shapes and locations of the various regions with respect to each other, the resulting thresholds of the trigger currents do not meet requirements in all instances.

To further adjust the thresholds of the trigger currents of the device 46 with respect to each other beyond what is permissible by planar arrangements, the resistance of the bases to lateral hole current flow, e.g., the resistivity due to impurities in the bases 61 and 65 and widths of such bases, as controlled with respect to each other. For instance, the base 61 adjacent the emitter region 54 is of greater width than the base 65 adjacent the emitter region 56. It has been found that by narrowing the width of the base 65 with respect to the width of the base 61, or by increasing the resistivity of the base 65 with respect to that of the base 61, the threshold at which a gate current triggers the device 46 to conduct in one direction, approaches the threshold at which a gate current triggers the device to conduct in the other direction. Consequently, as shown in the preferred embodiment of FIG. 2, by choosing the widths of the bases 61 and 64 in relationship to each other it becomes possible to alter and establish trigger currents for the device 46 without changing the planar layout of the various regions in the device.

Figure 3A:
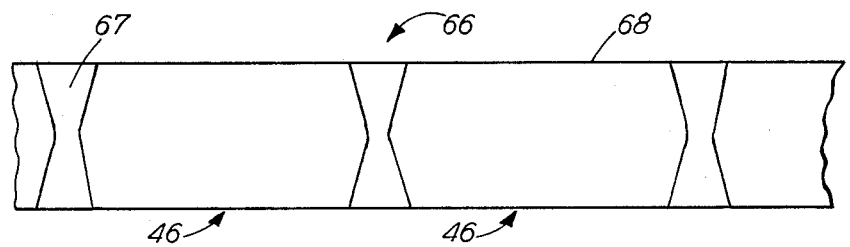
FIGS. 3a–3e show, schematically, base and emitter generation steps on both major surfaces of a typical semiconductor body formed in accordance with the present invention.
Figure 3B:
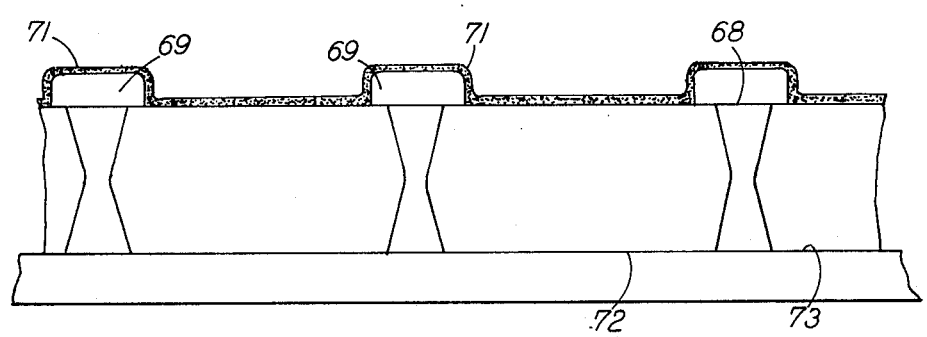
Figure 3C:
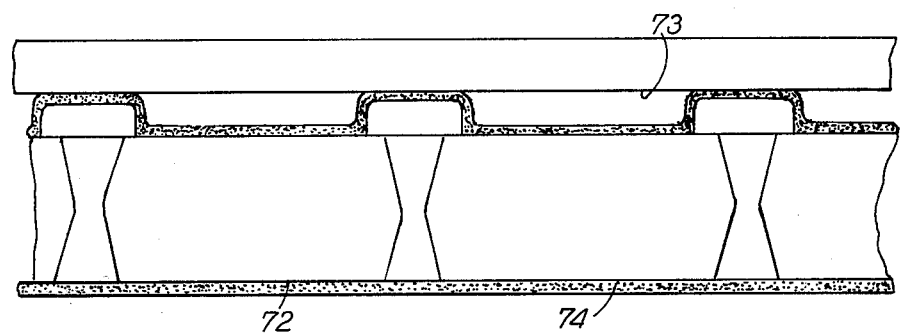
Figure 3D:
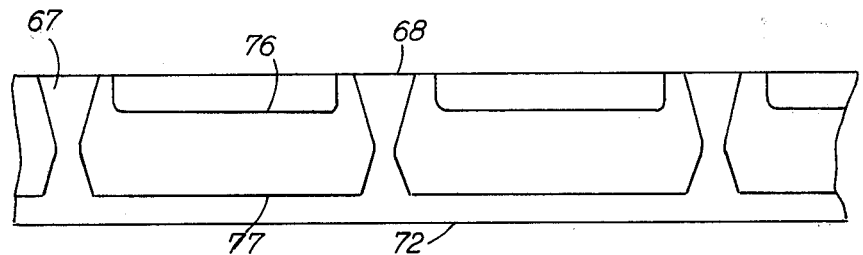
Figure 3E:
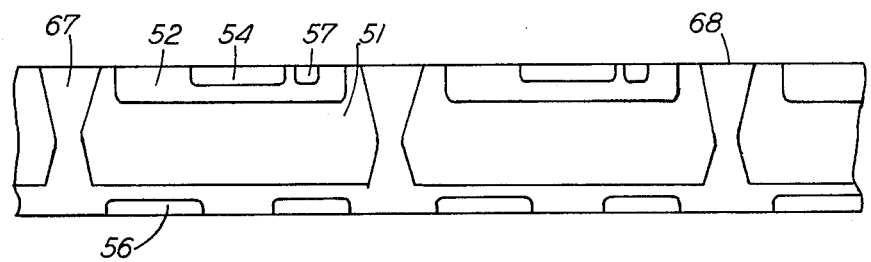

The preferred process by which the device 46 is formed is best explained in reference to FIGS. 3a-3e. In FIGS. 3d and 3e, oxides formed inherently during the various diffusion steps have been deleted to more clearly point out the essence of the steps. In FIG. 3a, a section through a portion of a wafer 66 is shown schematically and greatly enlarged. The wafer 66 is a single crystal of silicon material doped with *n* conductivity type impurities. Within the wafer 66, the various devices 46 are delineated by p conductivity type isolation region 67 driven into the wafer from both major surfaces thereof in accordance with known processing techniques. When the devices 46 are ultimately separated from the wafer 66 during final processing steps, the devices are cut from the wafer 66 through the centers of the isolation region 67 to establish the edges 59 of each device 46 as boundaries of the diffused regions 58.

Referring to FIG. 3b, a front surface 68 of the wafer 66 is selectively masked in accordance with known photolithographic processing techniques. The entire surface 68 is masked as a whole, and then windows are opened in deposited mask 69 to selectively expose the surface 68 to p-type (preferably boron) impurities. The impurities are deposited as an oxide layer 71 which contacts the surface 68 within the windows. The boron-doped oxide layer 71 remains spaced from the surface of the wafer 68 where the mask 69 remains on the surface. During the oxide deposition a back surface 72 of the wafer 66 remains masked by simply placing the wafer flat against a supporting surface 73. Consequently, oxide cannot form on the surface 72 for lack of exposure to oxidizing gases.

In FIG. 3c, the surface 68 has been placed against the supporting surface 73, and the surface 72 of the wafer 66 is exposed to oxidizing gases. In forming an oxide layer 74 on the surface 72 concentrations of the p-type impurities present in the oxidizing atmosphere have been reduced with respect to those present in the deposition of the layer 71. Consequently, the surface 72 is subjected to a lesser concentration of impurities than the surface 68. After a heating step, referred to as a "soak," which causes impurities to diffuse from the oxide to the surface of the wafer, the oxide layers 71 and 74 are removed. As already mentioned, various oxide masking layers are not shown in FIGS. 3d and 3e to more clearly point out the structure of the diffused regions within the wafer 66.

In FIG. 3d, the wafer 66 has been subjected to a diffusion step wherein the deposited p-type impurities migrate into the body of the wafer 66. The deposited impurities on both surfaces of the wafer are subjected to the same diffusion or drive in step. However, because the impurities have been deposited to a greater density on the surface 68 than on the surface 72, diffusion proceeds more rapidly from the surface 68 into the wafer than from the surface 72. Consequently, after a predetermined length of time, typically 10 to 16 hours at 1265° C, p-n junctions 76 and 77 have diffused into the wafer to approximately 24 microns from the surface 68 and to approximately 21 to 22 microns from the surface 72, respectively.

Thereafter, the n-type emitter pattern is generated on both surfaces 68 and 72 of the wafer. N-type impurities are deposited in equal concentrations on both surfaces of the wafer in accordance with the generated pattern. The emitter regions are then generated in a diffusion step which establishes respective n-p junctions within the previously diffused p-type regions.

FIG. 3e shows the wafer 66 after the n-type emitter regions have been diffused into the wafer and the surfaces have been cleaned of oxides. Because of the greater concentration of p-type impurities in the region 52 formed adjacent the surface 68, the diffusion of n-type impurities proceeds at a slower rate than the diffusion of the n-type impurities through the p-type region 53 formed adjacent the surface 72. The regions 54 and 57 form a junction with the region 52 at a depth of approximately 15 microns below the surface 68, while the junction J3 between the p-type region 53 and the n-type emitter region diffuses to approximately 17 microns from the surface 72 of the wafer 66. Consequently, the bases 61 and 65 have widths varying by a ratio of approximately 2:1 with respect to each other. The more narrow width of the base 65 renders the normally blocking rectifying junction J3 more easily saturated than if the base were wider. The widths of the bases preferably have a ratio of approximately 2:1, with the wider base being located in the path of the gate current. These widths adjust the thresholds of the currents required to trigger the device 46 in one or the other direction to become substantially equal.

The described method of generating bases of unequal widths near the respective surface of the device 46 require only one additional step over a method of forming a similar prior art device having bases of equal widths. This is particularly advantageous since the cost of making the devices plays a role in their usefulness as circuit components. While the described method is preferred because of its particular practical aspects, other methods can be employed to achieve similar results in equalizing the thresholds of the trigger currents.

For instance, the bases can be generated by first depositing p-type impurities in the manner described on the surface 68 of the wafer. The impurities are then diffused or driven into the wafer for a first time period. P-type impurities are then deposited on the surface 72 in substantially the same concentration as the prior deposition of the p-type impurities on the surface 68. Both impurity depositions are then necessarily simultaneously driven in for a second time period. This method results in a greater junction depth of the rectifying junction J2. However, because of a now lower p-type concentration near the surface 68 with respect to that near the surface 72, the subsequent n-type diffusion steps may have to be adjusted, to achieve a greater base width for the base 61.

Still another method lends itself in forming bases of unequal widths in the device. After diffusing an equal concentration of p-type impurities into the wafer 66 from both surfaces, the surface 72 may be either lapped back or chemically etched in accordance with known techniques. The n-type emitters are then diffused into one p-type region 52 adjacent the surface 68 which has the junction J2 at a greater depth than the junction J3 near the surface 72. Of course the thinning of the wafer by chemical or mechanical processing has to be tightly controlled to achieve the desired base width when the n-type emitters are diffused into the p-type regions.

The desired bases of unequal width can also be achieved by diffusing equal concentrations of p-type impurities into the wafer. The widths of the bases with respect to each other are then adjusted by depositing a greater concentration of n-type impurities on the surface 72 as compared to those deposited on the surface 68.

The latter embodiment is a typical example of achieving a higher resistance to lateral current flow by reducing the cross section or width of the base 65 with respect to the base 61 while maintaining substantially equal p-type impurity concentrations in each of the base regions. The preferred embodiment achieves a higher resistance to lateral current flow of the base 65 with respect to the base 61 by a combination of higher resistivity of the semiconductor material in the base 65 as well as a more narrow base width.

The foregoing invention has been described by way of a specific illustrative embodiment. It can be seen that various changes and modifications can be implemented with respect to what has been disclosed without departing from the spirit and scope of the invention. The invention is intended to be limited only by the scope of the appended claims.

What is claimed is:

1. A method of making a bidirectional semiconductor switching device comprising:

adjacent a body region of semiconductor material of one conductivity type, forming a first region of opposite conductivity type and of a first depth, and a second region of opposite conductivity type and of a second depth less than said first depth, said first and second regions interfacing with said body region in first and second rectifying junctions; and forming in each of said regions of opposite conductivity type a third region of the one conductivity type, each of said third regions interfacing with their respective regions of opposite conductivity type in third rectifying junctions, said third junction adjacent said first region being separated from said first junction by a distance greater than that which separates said third junction adjacent said second region from said second junction, to form between said body region and said third region in said second region a zone having a greater resistance to a current flow parallel to said junctions interfacing said second region with its adjacent regions than the resistance to a corresponding current flow in a corresponding zone in said first region parallel to its adjacent junctions.

2. A method according to claim 1 wherein said first and second regions are formed at first and second major surfaces of a semiconductor body, respectively, and impurities of the opposite conductivity type are driven from said first major surface into said body to form said first junction and from said second major surface into said body to form said second junction, and impurities of the one conductivity type are driven into the regions of opposite conductivity type formed at said first and second major surfaces in substantially equal concentrations and depths whereby said zone in said second region is formed with said greater resistance to current flow parallel its adjacent junctions in comparison with the resistance of said zone in said first region.

3. A method according to claim 1 wherein said first and second regions are formed adjacent first and second major surfaces of a semiconductor body containing said body region, said first and second regions being formed simultaneously on both sides by diffusing into said body from each of said major surfaces impurities of the opposite conductivity type, wherein said third regions are formed in said first and second regions adjacent said first and second major surface by diffusing into said body from each of said major surfaces impurities of the one conductivity type, and wherein the difference in the depths of diffusion of the impurities of the opposite conductivity type is obtained between said first and second regions by depositing prior to diffusing adjacent the first major surface an impurity concentration of the opposite conductivity type higher than an impurity concentration of the opposite conductivity type deposited adjacent the second major surface, and prior to forming said third regions depositing adjacent said first and second major surface impurities of the one conductivity type in concentrations which are substantially equal adjacent both major surfaces.

4. A method according to claim 1, wherein said first and second regions are formed on oppositely located first and second major surfaces of a semiconductor body, and wherein the first and second regions are formed to the first and second depths by simultaneously diffusing a substantially equal concentration of the opposite conductivity type impurities into both major surfaces of the body, then removing a layer of semiconductor material from the second major surface of the body, including the impurities within the layer, and diffusing a substantially equal concentration of the one conductivity type impurities simultaneously into both major surfaces of the body.

5. In a method of making a bidirectional semiconductor switching device of the type having first and second main terminals on the surface of a semiconductor body and a gate terminal adjacent the first main terminal, the gate terminal adapted to receive a current pulse to trigger the device to conduct current in either direction between the two main terminals, an improvement which tends to equalize current thresholds required to trigger the device to conduct in the one and in the other direction, the improvement comprising:

forming a first base region adjacent the first main terminal to a first depth in the body;

forming a second base region adjacent the second main terminal to a second depth in the body, said first depth being greater than said second depth; and forming emitters in each of the base regions to form first and second bases between said emitters and said body adjacent said first and second base regions, respectively, said first base having a base-width greater than that of the second base.

* * * * *

UNITED STATES PATENT OFFICE
CERTIFICATE OF CORRECTION

PATENT NO. : 4,066,483
DATED : January 3, 1978
INVENTOR(S) : Frederick A. D'Altroy; Daniel J. Harrington; Gerald W. Miller It is certified that error appears in the above-identified patent and that said Letters Patent are hereby corrected as shown below:

On the Abstract Page, the Assignee line should read:

--Assignees: -- Western Electric Company, incorporated, New Yor, N.Y., and Bell Telephone Laboratories, Incorporated, Murray Hill, N. J. --.

Column 6, line 45, "as" should be --are--.

Signed and Sealed this

Third Day of October 1978

[SEAL]

Attest:

RUTH C. MASON
Attesting Officer

DONALD W. BANNER
Commissioner of Patents and Trademarks